(12) United States Patent
Blacker et al.

(10) Patent No.: US 8,691,337 B2
(45) Date of Patent: Apr. 8, 2014

(54) TECHNIQUES FOR APPLYING MAR REDUCING OVERCOATS TO ARTICLES HAVING LAYER STACKS DISPOSED THEREON

(75) Inventors: Richard Blacker, Farmington, MI (US); Hong Wang, Shanghai (CN)

(73) Assignee: Guardian Industries Corp., Auburn Hills, MI (US)

( * ) Notice: Subject to any disclaimer, the term of this patent is extended or adjusted under 35 U.S.C. 154(b) by 947 days.

(21) Appl. No.: 12/379,482

(22) Filed: Feb. 23, 2009

(65) Prior Publication Data

US 2010/0215967 A1  Aug. 26, 2010

(51) Int. Cl.
*C23C 16/00* (2006.01)
*C23C 16/50* (2006.01)

(52) U.S. Cl.
USPC ............... 427/248.1; 118/723 VE; 118/50; 118/726

(58) Field of Classification Search
USPC ....................................... 427/248.1
See application file for complete search history.

(56) References Cited

U.S. PATENT DOCUMENTS

| | | | |
|---|---|---|---|
| 4,818,609 A | 4/1989 | Schmoock | |
| 6,101,316 A * | 8/2000 | Nagashima et al. | 392/388 |
| 6,106,659 A * | 8/2000 | Spence et al. | 156/345.43 |
| 6,179,277 B1 * | 1/2001 | Huston et al. | 261/128 |
| 6,180,245 B1 * | 1/2001 | Janssen et al. | 428/426 |
| 6,284,377 B1 | 9/2001 | Veerasamy | |
| 6,312,808 B1 | 11/2001 | Veerasamy et al. | |
| 6,335,086 B1 | 1/2002 | Veerasamy | |
| 6,338,901 B1 | 1/2002 | Veerasamy | |
| 6,610,360 B2 | 8/2003 | Petrmichl et al. | |
| 6,689,476 B2 | 2/2004 | Veerasamy et al. | |
| 7,138,186 B2 | 11/2006 | Luten, III | |
| 7,261,768 B2 | 8/2007 | Luten et al. | |
| 7,387,816 B2 | 6/2008 | Thomsen et al. | |
| 7,445,273 B2 | 11/2008 | Veerasamy et al. | |
| 2003/0072932 A1 * | 4/2003 | Gandon | 428/212 |
| 2003/0190422 A1 * | 10/2003 | Yoo | 427/248.1 |
| 2003/0228476 A1 * | 12/2003 | Buhay et al. | 428/469 |
| 2004/0191682 A1 * | 9/2004 | Marechal | 430/270.11 |
| 2005/0178652 A1 | 8/2005 | Murphy et al. | |
| 2006/0003545 A1 | 1/2006 | Veerasamy | |
| 2006/0110606 A1 | 5/2006 | Luten | |
| 2007/0213143 A1 | 9/2007 | Chinn et al. | |
| 2008/0220152 A1 | 9/2008 | Sharma | |
| 2008/0226926 A1 | 9/2008 | Thomsen et al. | |
| 2008/0271782 A1 | 11/2008 | Sharma | |

FOREIGN PATENT DOCUMENTS

FR  2 893 266  5/2007

OTHER PUBLICATIONS

International Search Report dated Mar. 11, 2011.

* cited by examiner

*Primary Examiner* — Timothy Meeks
*Assistant Examiner* — Mandy Louie
(74) *Attorney, Agent, or Firm* — Nixon & Vanderhye P.C.

(57) ABSTRACT

Certain example embodiments of this invention relate to techniques for applying an overcoat (e.g., which may include an organic material) to a coated article having a layer stack already disposed thereon in order to reduce the potential for surface marring. An evacuative process may be used to deposit the mar reducing overcoat. The coated article including the mar-reducing overcoat has a contact angle greater than, and a surface friction less than, a contact angle and a surface friction of the single- or multi-layer stack supported by the substrate alone. Any marring due to cat-scratching or the like preferably would not be visible at 4× magnification following application of the mar reducing overcoat.

15 Claims, 3 Drawing Sheets

| Sample | temp | time | Thickness estimate | Contact Angle (24 hour after deposition) | | | | |
|---|---|---|---|---|---|---|---|---|
| | | | | 1 | 2 | 3 | Average | Delta |
| 1 | 350 | 60 | 42 | 62.05 | 57.53 | 61.74 | 60.44 | 19.32 |
| 2 | 350 | 90 | 63 | 56.74 | 55.04 | 56.26 | 56.01 | 14.89 |
| 3 | 350 | 120 | 84 | 56.58 | 52.73 | 59.19 | 56.17 | 15.04 |
| 4 | 350 | 60 | 42 | 53.48 | 55.48 | 50.85 | 53.27 | 12.15 |
| 5 | 300 | 90 | 54 | 57.31 | 56.15 | 57.91 | 57.12 | 16.00 |
| 6 | 300 | 60 | 36 | 54.5 | 56.54 | 55.66 | 55.57 | 14.44 |
| 7 | 300 | 120 | 72 | 54.81 | 55.1 | 55.98 | 55.30 | 14.17 |
| 8 | 250 | 60 | 30 | 52.95 | 52.87 | 52.89 | 52.90 | 11.78 |
| 9 | 250 | 90 | 45 | 55.29 | 53.5 | 53.14 | 53.98 | 12.85 |
| 10 | 250 | 120 | 60 | 51.51 | 47.78 | 49.26 | 49.52 | 8.39 |
| 11 | 250 | 0 | 0 | 40.39 | 42.86 | 40.12 | 41.12 | 0.00 |
| 12 | 400 | 600 | 480 | 76.84 | 76.55 | 77.79 | 77.06 | 47.06 |
| 13 | 400 | 600 | 480 | 73.09 | 74.04 | 75.53 | 74.22 | 44.22 |
| 12 uncoated part | | | 0 | too low to measure, < 30 | | | | |
| 13 uncoated part | | | 0 | too low to measure, < 30 | | | | |

Fig. 4

TECHNIQUES FOR APPLYING MAR REDUCING OVERCOATS TO ARTICLES HAVING LAYER STACKS DISPOSED THEREON

FIELD OF THE INVENTION

Certain example embodiments of this invention relate to techniques for applying overcoats to already-coated, coated articles. More particularly, certain example embodiments of this invention relate to techniques for applying an overcoat (e.g., which may comprise an organic material) to a coated article having a layer stack already disposed thereon in order to reduce the potential for surface marring. The pre-coated layer stack may be a sputter-coated layer stack (e.g., for use in low-E or solar applications) in certain example embodiments, and the overcoat may be applied via an evacuative process in certain example embodiments.

BACKGROUND AND SUMMARY OF EXAMPLE EMBODIMENTS OF THE INVENTION

Disposing single-layer and multiple-layer coatings on articles, e.g., by sputtering or the like, is known in the art. Current sputter-deposited low-E coatings are known in the industry as soft-coatings, as they typically are very easy to damage during normal handling. By way of example, standard sputter-coated low-E coatings suffer from a failure known as scratching and, in general, are considered soft coatings.

The potential for damage to coated articles is a disadvantage typical for many sputter-coated and/or otherwise disposed coatings. Indeed, the potential for damage often prompts manufacturers to take special care during the disposing of the coatings including the steps used therein. the transportation of intermediate and/or finished products, any finishing and/or installation steps, etc. These special measures increase the costs and time required for making coated articles. Even when a wide variety of special precautions are taken, the potential for damage, e.g., by marring is still present, and quite often yield is reduced.

Thus, it will be appreciated that there is a need in the art for techniques for protecting layer stacks disposed on articles.

The inventors of the instant application have realized that the ease with which soft-coatings may be scratched may be attributed, at least in part, to surface roughness of the coatings and also the weak nature of the bonds between the layer stack and the glass and/or the layers in a layer stack. Thus, the inventors of the instant application have discovered that the surface energy can be modified to reduce friction caused by surface roughness, thereby enhancing mar resistance. Indeed, the inventors of the instant application have discovered that by applying a "slippery" overcoat to pre-coated layer stacks, the propensity for scratch marring is reduced. In certain example embodiments, the overcoat may be applied via an evacuative process.

In certain example embodiments of this invention, a method of making a coated article by applying a mar reducing overcoat to an intermediate coated article is provided. The intermediate coated article is provided, with the intermediate coated article comprising a substrate with a single- or multi-layer stack disposed thereon. The mar reducing overcoat is applied to the intermediate coated article via an evacuative process, such that coated article with the mar reducing overcoat has a contact angle greater than, and a surface friction less than, a contact angle and a surface friction of the intermediate coated article.

According to certain example embodiments, the evacuative process may include the following steps. A low vapor pressure material may be provided in liquid form to a heatable vacuum compatible chamber connected to a coater, with a coater vent buffer being interposed between the heatable chamber and the coater. The heatable chamber may be evacuated as the coater pumps to the same pressure as the coater vent buffer. When vacuum is achieved, vapor in the heatable chamber may be built up. When the coater needs to be vented: the vent buffer is vented, and the heated chamber is purged to draw substantially all of the vapor into the coater vent buffer. When venting is complete, the vapor storage buffer is partially evacuated.

First and second valves may be provided to the heatable chamber, with the second valve being located between the heatable chamber and the coater vent buffer, and with the first value being located upstream of the heatable chamber. The evacuating step may comprise opening the second valve and closing the first valve, the building up step may comprise closing the second valve, the purging step may comprise opening the second valve and then opening the first valve, and the partially evacuating step may comprise closing the first valve, waiting a predetermined amount of time, and closing the second valve.

In certain example embodiments of this invention, a coated article is provided. A single- or multi-layer stack is supported by a substrate. A mar-reducing overcoat comprising an organic material is provided, directly or indirectly, on the single- or multi-layer stack opposite the substrate. The coated article including the mar-reducing overcoat has a contact angle greater than, and a surface friction less than, a contact angle and a surface friction of the single- or multi-layer stack supported by the substrate alone.

In certain example embodiments of this invention, an apparatus is provided. A chamber is connected to a coater, with a coater vent buffer being interposed between the heatable chamber and the coater, and with the chamber being configured to contain a low vapor pressure material in liquid form. A vacuum is configured to create vacuum conditions within the chamber. A heating mechanism is configured to selectively heat the chamber and vaporize the liquid form material located therein so as to build up vapor in the heatable chamber when vacuum is achieved. Evacuating means are provided for evacuating the chamber as the coater pumps to the same pressure as the coater vent buffer. Venting means are provided for venting the vent buffer and purging the heated chamber to draw substantially all of the vapor into the coater vent buffer when the coater needs to be vented, and for partially evacuating the chamber when venting is complete.

The features, aspects, advantages, and example embodiments described herein may be combined to realize yet further embodiments.

BRIEF DESCRIPTION OF THE DRAWINGS

These and other features and advantages will be better and more completely understood by reference to the following detailed description of exemplary illustrative embodiments in conjunction with the drawings, of which:

FIG. 4 is a table showing contact angle data measured from a plurality of samples produced according to certain example embodiments; and

DETAILED DESCRIPTION OF EXAMPLE EMBODIMENTS OF THE INVENTION

Certain example embodiments of this invention relate to the application of overcoats on pre-coated layer stacks. The overcoat may comprise an organic material in certain example embodiments. The organic overcoat material preferably is hydrophobic (e.g., so as to repel water, for example), although the present invention is not so limited. Indeed, the organic overcoat material also may be oleophobic (e.g., so as to repel oils, for example) in certain example embodiments. The application of the overcoat may take place in many ways, and several examples are presented below and, in certain example embodiments, the overcoat may be applied via an evacuative process. The coated article including the mar-reducing overcoat has a contact angle greater than, and a surface friction less than, a contact angle and a surface friction of the single- or multi-layer stack supported by the substrate alone. Any marring due to cat-scratching or the like preferably would not be visible at 4× magnification following application of the mar reducing overcoat.

A first example technique for applying a mar reducing overcoat involves the application of a water soluble material during coater exit washer usage. As is known, intermediate or final articles typically are washed when they exit a coater. A water soluble material may be added to the flow of water in certain example embodiments, thus effectively "washing" the article as it exits the coater and allowing the overcoat to form directly or indirectly on the pre-coated layer stack. This technique is advantageous in that it is simple to implement from a technical standpoint. It is also cost effective in that a wide variety of commonly available materials could be used in connection with existing processes.

A second example technique for applying a mar reducing overcoat involves application via plasma enhanced chemical vapor deposition (PECVD) via in situ ion beam technology. In certain example embodiments, organic precursors such as HMDSO or fluorinated materials may be employed to coat the stack using ion beam deposition. Because coater deposition zone "real estate" typically is at a high premium, this technique may be carried out in the exit lock in certain example embodiments. Of course, other zones of the coater may be used in certain other example embodiments. It will be appreciated that when this technique is carried out in the exit lock, reliability may become an issue because of the cycling on/off operations during service as the vacuum pressure rises from base to atmosphere. Accordingly, it may be necessary to control the process conditions to improve the reliability in example embodiments that implement this technique.

Figure 1:
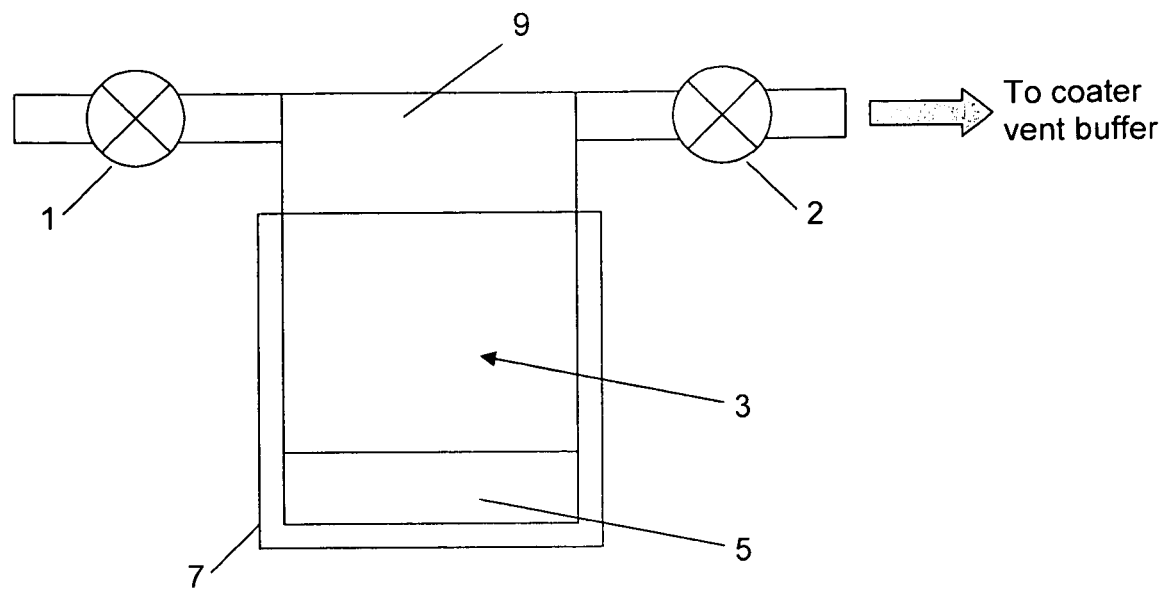
FIG. 1 is a portion of an apparatus for applying a mar reducing overcoat to a pre-coated substrate by feeding a vapor phase material into the normal vent gas stream for a coater, in accordance with an example embodiment.
Figure 2:
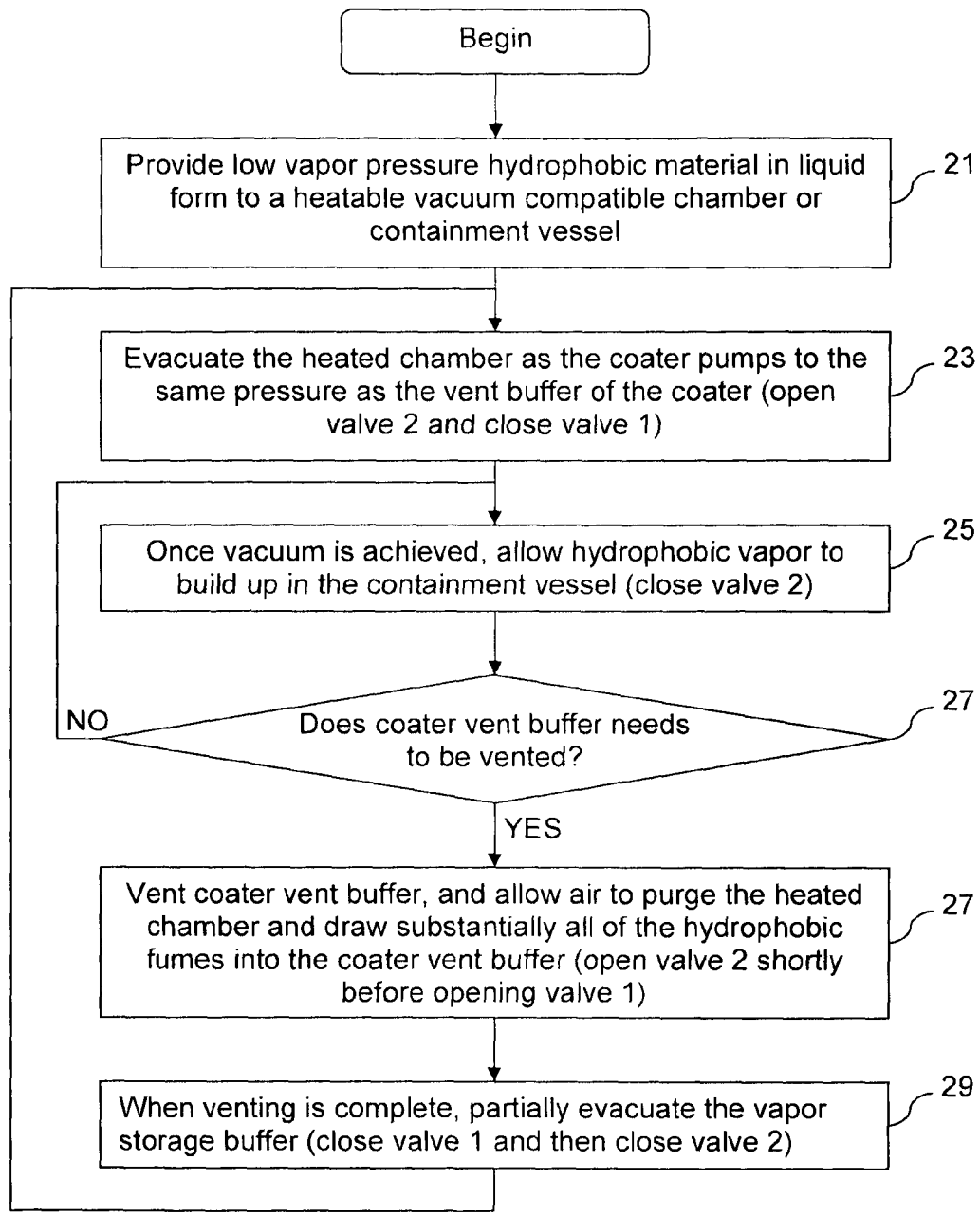
FIG. 2 is an illustrative flowchart for applying a mar reducing overcoat to a pre-coated substrate by feeding a vapor phase material into the normal vent gas stream for a coater, in accordance with an example embodiment.

A third example technique for applying a mar reducing overcoat involves application by feeding a vapor phase material into the normal vent gas stream for a coater, e.g., as shown in FIG. 1, which essentially is a hydrophobic vapor storage buffer as will become clear from the description that follows below. The example process steps described below are shown visually in FIG. 2. In certain example embodiments, a low vapor pressure hydrophobic material at least initially in liquid form 5 is contained within a vacuum compatible chamber or containment vessel 3 that is heatable (e.g., using a heated mantle 7 or other suitable heating element, such as a heated plate, one or more heating wires, etc.), with the chamber 3 having controlled vent and vacuum side valves 1 and 2 (step 21). Side valve 2 is connected (and thus located proximate) to the coater vent buffer whereas side valve 1 is located remote from the coater and thus upstream of the heatable chamber.

In certain example operations, the heated chamber 3 is evacuated, as the coater pumps to the same pressure as the vent buffer of the coater (step 23). Referring to FIG. 1, the heated box vacuum valve 2 is open while value 1 is closed. With vacuum achieved, valve 2 is closed and hydrophobic vapor 9 is allowed to build up in the containment vessel 3 (step 25).

It is determined whether the coater vent buffer needs to be vented (step 27). When the coater vent buffer needs to be vented, valve 2 is opened shortly before valve 1 is opened to allow air to purge the heated chamber 3 and thus draw substantially all of the hydrophobic fumes into the coater vent buffer. When venting is complete, valve 1 is closed and, after a predetermined time, valve vent 2 also is closed. By waiting the predetermined amount of time, partial evacuation of the vapor storage buffer is allowed (step 29). Coater buffer pumping continues as normal as hydrophobic vapor 9 builds up in the heated box 3 (e.g., under partial vacuum) until needed for venting into the coater vent buffer, as above.

In essence, the vapor with the low pressure hydrophobic material is vented towards the coated article ultimately condenses on the pre-coated article and the overcoat is formed thereon.

For safety reasons, a pressure monitor optionally may be provided to the system partially shown in FIG. 1. If the pressure exceeds a predetermined threshold (e.g., from excess vapor build-up), the pressure may be released automatically.

Figure 3:
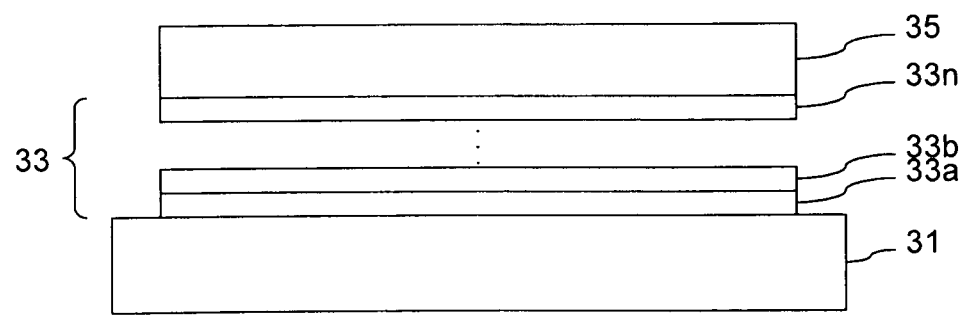
FIG. 3 is a cross-sectional view of an example coated article produced using the techniques of certain example embodiments.

Regardless of the particular evacuative technique used to dispose the "slippery" overcoat to the pre-coated layer stack, the resulting coated article will appear cross-sectionally similar to that which is shown in FIG. 3 (assuming that the pre-coated layer stack is a multi-layer stack rather than a single layer coating). In other words, FIG. 3 is a cross-sectional view of an example coated article produced using the techniques of certain example embodiments. A substrate (e.g., a glass substrate) 31 is provided. The substrate 31 supports a pre-coated layer stack 33, which may comprise one or more layers 33$a$-$n$. The overcoat layer 35 is disposed, directly or indirectly, on the uppermost layer 33$n$ in the pre-coated layer stack 33. The overcoat layer 35 preferably has a surface friction and a contact angle less than the pre-coated layer stack 33. As is known, the term "contact angle" is indicative of the angle at which a liquid or vapor interface meets a solid surface, in this case, the overcoat layer 35. In certain example embodiments, the liquid or vapor is water and, thus, the "contact angle" relates to the angle at which a liquid or vapor water interface meets the overcoat layer 35. Of course, it will be appreciated that other liquids or vapors could be used in connection with other example embodiments using the techniques described herein.

EXAMPLE

One example material that may be used in connection with certain example embodiments is commercially available from Umicore under the tradename SuperHydrophobic Top-Coat. This example material is a pellet material comprising porous alumina imbibed with the hydrophobic liquid. It will be appreciated that a liquid lacking pellets may be used in certain example embodiments.

Using the above-noted example material in connection with the example embodiments shown and described in connection with FIG. 1 produced an overcoat that resulted in no observable color shift. However, surface contact angle was increased from about 10-25 degrees for the initially coated glass to up to about 75 degrees following the application of the overcoat. To simulate scratching, durability testing was performed by damaging and baking a coated article having an overcoat formed using the above-noted example material in connection with the example embodiments shown and described in connection with FIG. 1. Under normal, non-treated conditions, severe damage was visible. In contrast, when the example was tested, damage due to the simulated scratching was greatly reduced (and sometimes virtually eliminated). Indeed, when the example was tested, damage was only visible microscopically with magnification well above the 4× damage threshold that often is used as a standard for product acceptability.

Given the above, it will be appreciated that the techniques of certain example embodiments apply an overcoat to already-formed layer stacks. Such overcoats preferably result in no observable color shift, for example, such that delta E* preferably is less than about 10, more preferably is less than about 5, still more preferably is less than about 3, and still more preferably is less than about 2. In general, delta E* may be controlled to 3-5 (or even lower) without significantly affecting the durability of the overcoat in certain example embodiments, and this may be achieved, for example, by varying the overcoat thickness. Such overcoats also offer increases in surface contact angle as compared to the pre-coated layer stack, preferably to greater than about 50 degrees, more preferably to greater than about 60 degrees, and still more preferably to greater than about 70 degrees. Such overcoats preferably have an average surface roughness less than about 0.1 um, more preferably less than about 0.01 um. Such overcoats also offer a level of durability such that evidence of scratching preferably is not visible to the naked eye, more preferably at 2× magnification, more preferably at 4× magnification, and still more preferably at 10× magnification.

FIG. 4 is a table showing contact angle data measured from a plurality of samples produced according to certain example embodiments. The contact angle measurements in FIG. 4 were taken 24 hours after the deposition of the hydrophobic material. The process conditions for each sample are provided, with the temperature being in degrees C, the time being in seconds, and the thickness estimation simply being a multiplication of the temperature and time. Sample 11 is a reference sample, in that no hydrophobic material was deposited on the glass substrate thereof, and the values in the "Delta" column represent the difference between the average contact angle and this reference value. As can be seen from FIG. 4, the contact angle increased an average of 15 degrees for the initial 10 samples unless there was significantly increase time and temperature. For the 400 degree C. 10 minute samples, the increase in contact angle is about 45 degrees. However, the thickness of the deposition might be significantly higher for these samples, as suggested from the optical data.

A brush test was performed on all of the samples shown in FIG. 4. The brush test involved up to 2000 strokes. A higher improvement for as-coated samples with thicker hydrophobic layers (e.g., those with very high contact angles) was observed. Additionally, after heat treatment, all samples performed very well. A crock-bake test also was performed on all of the samples shown in FIG. 4. The crock-bake test showed no damage to any of the coated article samples, but did show light and medium damage to the uncoated reference sample at values of 50 and 100, respectively.

It will be appreciated that the example embodiments described herein may be used in connection with the application of a mar reducing overcoat, directly or indirectly, on single layer or multiple layer coatings. Such single layer or multiple layer coatings may be deposited by any suitable means including, for example, sputtering, chemical vapor deposition (CVD), combustion CVD, flame or spray pyrolysis, spin coating, sol-gel coating, etc.

Furthermore, although certain example embodiments have been described in connection with low-E and/or solar applications, the present invention is not so limited. In other words, the example embodiments described herein may be used in connection with other applications where it is desirable to reduce the likelihood of marring, e.g., via cat-scratching or the like. Indeed, it will be appreciated that the overcoats of the example embodiments described herein may be applied to a variety of products including, for example, photovoltaic, green house, sports and roadway lighting, fireplace and oven doors, picture frame glass, etc.

While a particular layer or coating may be said to be "on" or "supported by" a surface or another coating (directly or indirectly), other layer(s) and/or coatings may be provided therebetween. Thus, for example, a coating may be considered "on" and "supported by" a surface even if other layer(s) are provided between layer(s) and the substrate. Moreover, certain layers or coatings may be removed in certain embodiments, while others may be added in other embodiments of this invention without departing from the overall spirit of certain embodiments of this invention. Thus, by way of example, an encapsulating coating applied in liquid sol-gel form in accordance with an example embodiment may be said to be "on" or "supported by" a sputtering target material, even though other coatings and/or layers may be provided between the sol-gel formed coating and the target material.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a coated article by applying a mar reducing overcoat to an intermediate coated article, the method comprising:

having the intermediate coated article, the intermediate coated article comprising a substrate with a low-E coating disposed thereon;

applying the mar reducing overcoat to the intermediate coated article via an evacuative process such that the coated article with the mar reducing overcoat applied thereon has an average surface roughness of less than 0.1 um, as well as a contact angle greater than, and a surface friction less than, a contact angle and a surface friction of the intermediate coated article with the low-E coating, the low-E coating being located between at least the substrate and the mar reducing overcoat;

wherein said applying comprises:

providing a low vapor pressure material in liquid form to a heatable vacuum compatible chamber connected to a coater, with a coater vent buffer being interposed between the heatable chamber and the coater;

evacuating the heatable chamber as the coater pumps to the same pressure as the coater vent buffer;

when vacuum is achieved, building up vapor in the heatable chamber; and when the coater needs to be vented, venting the vent buffer, and purging the heated chamber to draw substantially all of the vapor into the coater vent buffer, and when venting is complete, partially evacuating the chamber, and wherein the mar reducing overcoat has a thickness selected so that the mar reducing overcoat provides a delta E* color shift of no more than 5 relative to the underlying low-E coating.

2. The method of claim 1, wherein first and second valves are provided to the heatable chamber, the second valve being located between the heatable chamber and the coater vent buffer, and the first valve being located upstream of the heatable chamber.

3. The method of claim 2, wherein said evacuating comprises opening the second valve and closing the first valve, said building up comprises closing the second valve, said purging comprises opening the second valve and then opening the first valve, and said partially evacuating comprises closing the first valve, waiting a predetermined amount of time, and closing the second valve.

4. The method of claim 3, further comprising automatically venting the heatable chamber if the pressure therein exceeds a predetermined threshold.

5. The method of claim 1, wherein the mar reducing overcoat comprises organic material.

6. The method of claim 5, wherein the mar reducing overcoat is a hydrophobic layer.

7. The method of claim 5, wherein the mar reducing overcoat is an oleophobic layer.

8. The method of claim 1, wherein the mar reducing overcoat comprises silicon and/or is fluorinated.

9. The method of claim 1, wherein any marring due to cat-scratching would not be visible at 4× magnification as a result of the application of the mar reducing overcoat.

10. The method of claim 1, wherein the mar reducing overcoat has an average surface roughness of less than 0.01 um.

11. The method of claim 1, wherein the mar reducing overcoat has a thickness selected so that the mar reducing overcoat provides a delta E* color shift of no more than 3 relative to the underlying low-E coating.

12. The method of claim 1, wherein the mar reducing overcoat is a single layer.

13. The method of claim 1, wherein the mar reducing overcoat is a single layer and has a thickness selected so that the mar reducing overcoat provides a delta E* color shift of no more than 3 relative to the underlying low-E coating.

14. The method of claim 13, wherein any marring due to cat-scratching would not be visible at 2× magnification as a result of the application of the mar reducing overcoat.

15. The method of claim 14, wherein the mar reducing overcoat provides a contact angle at least three times greater than a contact angle of the low-E coating initially on the intermediate coated article.

* * * * *